(12) United States Patent
Kim

(10) Patent No.: US 7,184,731 B2
(45) Date of Patent: Feb. 27, 2007

(54) VARIABLE ATTENUATOR SYSTEM AND METHOD

(76) Inventor: Gi Mun Kim, Jugong Apt. 313-305, Byulyang-Dong, Gwaelieon, Gyunggi-Do (KR)

( * ) Notice: Subject to any disclaimer, the term of this patent is extended or adjusted under 35 U.S.C. 154(b) by 398 days.

(21) Appl. No.: 10/705,518

(22) Filed: Nov. 10, 2003

(65) Prior Publication Data

US 2004/0157575 A1    Aug. 12, 2004

(30) Foreign Application Priority Data

Nov. 12, 2002   (KR)   ............ 10-2002-0070154

(51) Int. Cl.
    *H04B 1/40*    (2006.01)
(52) U.S. Cl. ............ 455/249.1; 455/289; 333/81 R
(58) Field of Classification Search ............ 455/249.1, 455/289; 327/314, 308; 333/81 R, 32, 103
    See application file for complete search history.

(56) References Cited

U.S. PATENT DOCUMENTS

| 3,663,900 | A | * | 5/1972 | Peterson | .......... | 333/81 R |
| 3,859,609 | A | * | 1/1975 | Couvillon et al. | ........ | 333/81 A |
| 4,047,131 | A | * | 9/1977 | Ludikhuize | .......... | 333/81 R |
| 4,097,827 | A | * | 6/1978 | Williams | .......... | 333/81 R |
| 4,590,417 | A | * | 5/1986 | Tanaami et al. | .......... | 323/229 |
| 4,656,610 | A | * | 4/1987 | Yoshida et al. | .......... | 365/189.07 |
| 4,754,240 | A | * | 6/1988 | Marconi | .......... | 333/81 A |
| 5,126,703 | A | * | 6/1992 | Kosuga | .......... | 333/81 R |
| 5,140,200 | A | * | 8/1992 | Stanton | .......... | 327/308 |
| 5,204,543 | A | * | 4/1993 | Hanazawa et al. | .......... | 257/378 |
| 5,204,643 | A | * | 4/1993 | Verronen | .......... | 333/81 R |
| 6,028,647 | A | * | 2/2000 | Fukai et al. | .......... | 348/731 |
| 6,091,299 | A | * | 7/2000 | Gruneisen | .......... | 330/149 |
| 6,448,867 | B1 | * | 9/2002 | Kossor | .......... | 333/81 A |
| 6,919,774 | B2 | * | 7/2005 | Ritchey et al. | .......... | 333/81 R |
| 6,973,288 | B1 | * | 12/2005 | Davis et al. | .......... | 455/67.11 |

FOREIGN PATENT DOCUMENTS

| JP | 62071316 | | 4/1987 |
| JP | 02285807 | * | 11/1990 |
| JP | 03-013111 | | 1/1991 |
| JP | 4-75423 | | 7/1992 |
| JP | 406152301 A | * | 5/1994 |
| JP | 08-008675 | | 1/1996 |
| JP | 10163786 | | 6/1998 |
| JP | 2000 286659 | | 10/2000 |

* cited by examiner

*Primary Examiner*—Edward F. Urban
*Assistant Examiner*—Blane J. Jackson
(74) *Attorney, Agent, or Firm*—Lee, Hong, Degerman, Kang & Schmadeka

(57) ABSTRACT

A variable attenuator comprising a first attenuator for attenuating a RF signal according to a fixed voltage, a second attenuator connected in parallel to the first attenuator and attenuating the RF signal according to a control voltage for determining an attenuation mode, and a first impedance matching unit for maintaining input/output impedance matching of the second attenuator.

23 Claims, 2 Drawing Sheets

VARIABLE ATTENUATOR SYSTEM AND METHOD

CROSS-REFERENCE TO RELATED APPLICATIONS

Pursuant to 35 U.S.C. § 119(a), this application claims the benefit of earlier filing date and right of priority to the Korean Application No. 2002-70154, filed on Nov. 12, 2002, the content of which is hereby incorporated by reference herein in its entirety.

BACKGROUND OF THE INVENTION

1. Field of the Invention

The present invention relates to a variable attenuator, and in particular to a variable attenuator capable of maintaining input/output impedance matching in an attenuation mode.

2. Description of the Related Art

In a mobile communication system, a base station includes a receiver. The receiver adjusts reception sensitivity of reception paths by adjusting a signal to noise ratio (S/N) by attenuating a radio frequency signal transmitted from a mobile communication terminal with a variable attenuator.

In general, an attenuation value of the variable attenuator is controlled by a control voltage. The variable attenuator is required to have attenuation characteristics in linear proportions to a control voltage and have small insertion loss when it does not attenuate a reception signal.

Accordingly, in order to maintain the attenuation characteristics linearly, the variable attenuator has to be designed so as to maintain impedance matching of an input/output block although an attenuation adjustment range (high attenuation mode) is increased in a high frequency circuit.

FIG. 1 is a circuit diagram illustrating a conventional variable attenuator. As depicted in FIG. 1, the conventional variable attenuator includes capacitors C1 and C2 serial-connected between an input terminal RFin and an output terminal RFout; resistors R1 and R2 parallel-connected to the input and output terminals Rfin and RFout respectively; an inductor L1 parallel-connected between the capacitors C1 and C2; an inductor L2 for receiving a control voltage; a PIN diode D1 serial-connected between the inductors L1 and L2; and a capacitor C3 parallel-connected to an anode of the PIN diode D1. The capacitors C1 and C2 remove DC element from a RF signal, and the inductors L1 and L2 remove RF element from a control voltage.

In general, resistance element of the PIN diode D1 is varied according to a DC bias (control voltage). It is possible to adjust attenuation of the PIN diode D1. In order to increase attenuation of the RF signal, a DC bias is increased. In order to decrease attenuation of the RF signal, a DC bias is decreased. In addition, in order not to attenuate the RF signal, a DC bias is not applied.

When a DC bias of 0V (e.g., a control voltage of 0V) is applied, the variable attenuator is operated in a low attenuation mode. In the low attenuation mode, the PIN diode D1 is turned off by the control voltage of 0V, and accordingly internal resistance approaches infinity (∞).

The RF signal applied through the input terminal RFin is transmitted to the output terminal RFout through the capacitors C1 and C2 without being attenuated. Input/output impedance is maintained as 50Ω by the resistors R1 and R2.

By increasing the control voltage, the PIN diode D1 reaches a turn-on voltage (0.6~0.7V), the PIN diode D1 is turned on, and resistance of the PIN diode D1 is decreased. Because the RF signal transmitted through the capacitor C1 leaks to the ground through the PIN diode D1 and the capacitor C3, the RF signal is rapidly attenuated. The capacitor C3 sets an attenuated frequency range.

When the control voltage is not less than 1.3V, the variable attenuator is operated in a high attenuation mode, because resistance of the PIN diode D1 is 0Ω in the high attenuation mode. The RF signal transmitted through the capacitor C1 leaks to the ground through the PIN diode D1 and the capacitor C3. Accordingly, any RF signal is not transmitted to the output terminal RFout. Herein, input/output impedance is 0Ω.

In a conventional attenuator, in the low attenuation mode having the control voltage of 0V, input/output impedance is maintained at 50Ω. In the high attenuation mode having the control voltage not less than 1.3V, input/output impedance is 0Ω. In general, the attenuator has to maintain impedance matching regardless of attenuation of the PIN diode. That is, it has to maintain input/output impedance at 50Ω continually in the low attenuation mode and the high attenuation mode in order to perform stable matching with other elements.

In a conventional variable attenuator, impedance matching can be maintained in the low attenuation mode. However, impedance matching cannot be maintained in the high attenuation mode, and accordingly it is impossible to secure stability of a system. Accordingly, when the conventional attenuator is used for a LNA (low noise amplifier) of a reception block, pass band characteristics of a duplexer and a high frequency filter have to be varied. In particular, the reception level of a RF signal is lowered due to impedance mismatching with an antenna. As such, a method and system is needed to overcome the problems associated with the related art attenuator.

SUMMARY OF THE INVENTION

In order to solve the above-mentioned problem, the present invention to provides a variable attenuator which is capable of maintaining impedance matching in various attenuation modes. In accordance with one embodiment, a variable attenuator comprises a first attenuator for attenuating a RF signal according to a fixed voltage; a second attenuator connected in parallel to the first attenuator and attenuating the RF signal according to a control voltage for determining an attenuation mode; and a first impedance matching unit for maintaining input/output impedance matching of the second attenuator.

The attenuator may further comprise a second impedance matching unit for maintaining input/output impedance matching of the first attenuator, a first capacitor for removing serial current elements from an input RF signal and for providing the RF signal to the first attenuator; and a second capacitor for removing serial current elements from an output signal of the first and second attenuators.

In one embodiment, the first attenuator comprises a short key diode, the fixed voltage is a power voltage divided by a certain level and the RF signal flows to the first attenuator in a low attenuation mode. The RF signal flows to the second attenuator in a high attenuation mode and the RF signal flows to the first and second attenuators in an intermediate attenuation mode, in one or more embodiments.

The second attenuator comprises a third capacitor connected in parallel to an input terminal of the first attenuator, a first short key diode for attenuating the RF signal transmitted through the third capacitor. The second attenuator comprises a second short key diode connected in parallel to an output terminal of the first attenuator. The second attenuator comprises a first and a second resistance means connected in serial between anodes of the first and second short key diodes. In certain embodiments, the second attenuator comprises a control voltage input terminal is provided between the first and second resistance means.

A variable attenuator, in accordance with other embodiments of the invention comprises a first attenuator for attenuating a RF signal according to a first voltage; a first impedance matching unit for maintaining impedance matching of the first attenuator in a low attenuation mode; a second attenuator provided between input and output terminals of the first attenuator for attenuating the RF signal according to a control voltage for determining an attenuation mode; and a second impedance matching unit for maintaining input/output impedance matching of the second attenuator in a high attenuation mode.

The first and second impedance matching units have the same resistance. The second impedance matching unit comprises at least two resistors provided between the second attenuator and a ground connection and each resistance is 50Ω. The RF signal flows to the first attenuator in a low attenuation mode and flows to the second attenuator in a high attenuation mode. The RF signal flows to the first and second attenuators in an intermediate attenuation mode.

In one embodiment, the second attenuator comprises a third capacitor connected in parallel to an input terminal of the first attenuator for cutting off a control voltage to the first attenuator; a first short key diode for attenuating the RF signal transmitted through the third capacitor; a second short key diode connected in parallel to an output terminal of the first attenuator; and first and second resistance means corrected to anodes of the first and second short key diodes for applying the control voltage.

In accordance to yet another embodiment, a variable attenuator comprises a first short key diode for attenuating a RF signal according to a first voltage; a second short key diode, connected in parallel to an anode of the first short key diode for attenuating the RF signal, according to a control voltage; a third short key diode connected in parallel to a cathode of the first short key diode for attenuating the RF signal, according to the control voltage; a first resistor provided between a cathode of the short key diode and a ground connection; and a second resistor provided between a cathode of the third short key diode and the is ground connection.

The attenuator may further comprise a capacitor connected to the anode of the first short key diode for cutting off a control voltage provided to the first short key diode and third and fourth resistors for applying the control voltage to the anodes of the second and third short key diodes, respectively. The first and second resistors are approximately 50Ω. The RF signal flows to the first short key diode, in a low attenuation mode. The RF signal flows to the second and third short key diodes in a high attenuation mode. In some embodiments, the RF signal flows to the first, second, and third short key diodes, in an intermediate attenuation mode.

These and other embodiments of the present invention will also become readily apparent to those skilled in the art from the following detailed description of the embodiments having reference to the attached figures, the invention not being limited to any particular embodiments disclosed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

Features, elements, and aspects of the invention that are referenced by the same numerals in different figures represent the same, equivalent, or similar features, elements, or aspects in accordance with one or more embodiments of the system.

DETAILED DESCRIPTION OF THE PREFERRED EMBODIMENT

Figure 1:
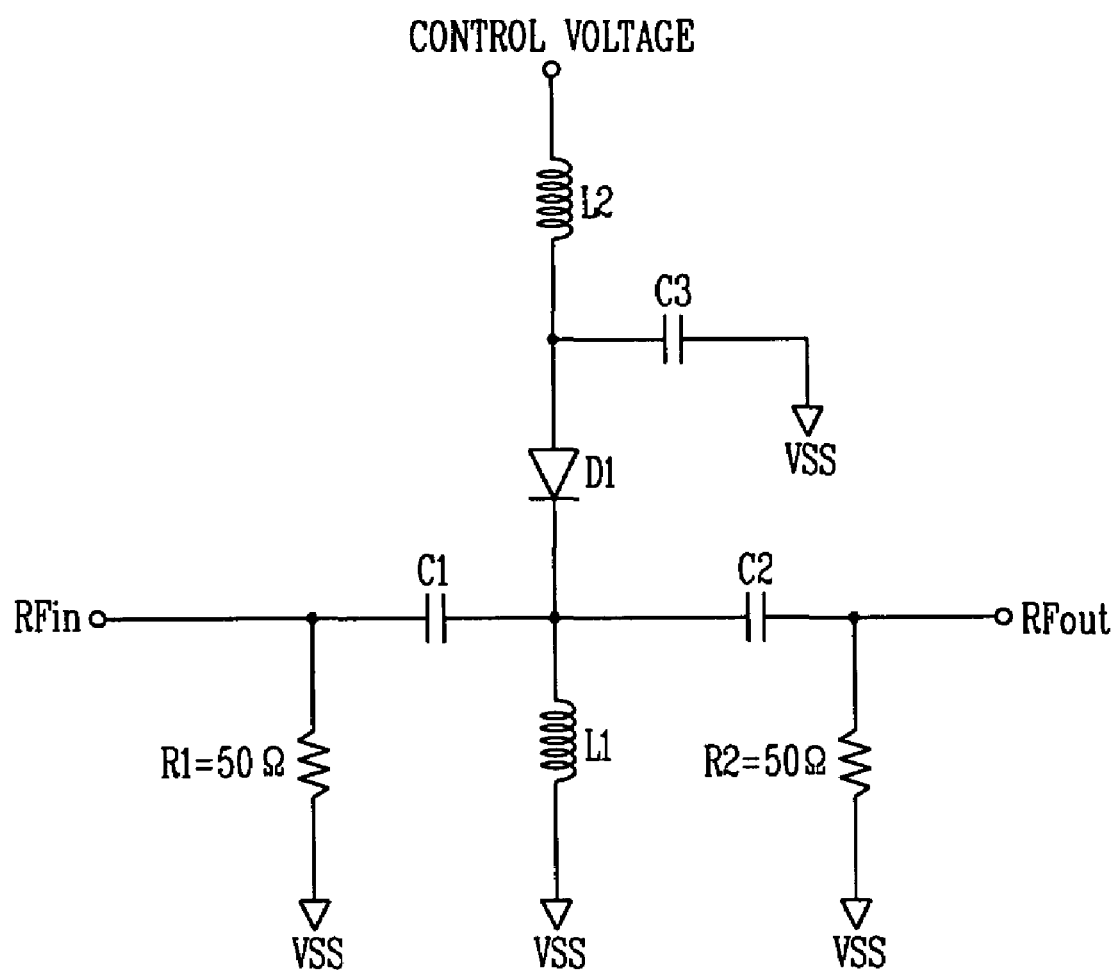
FIG. 1 is a circuit diagram illustrating a conventional variable attenuator.
Figure 2:
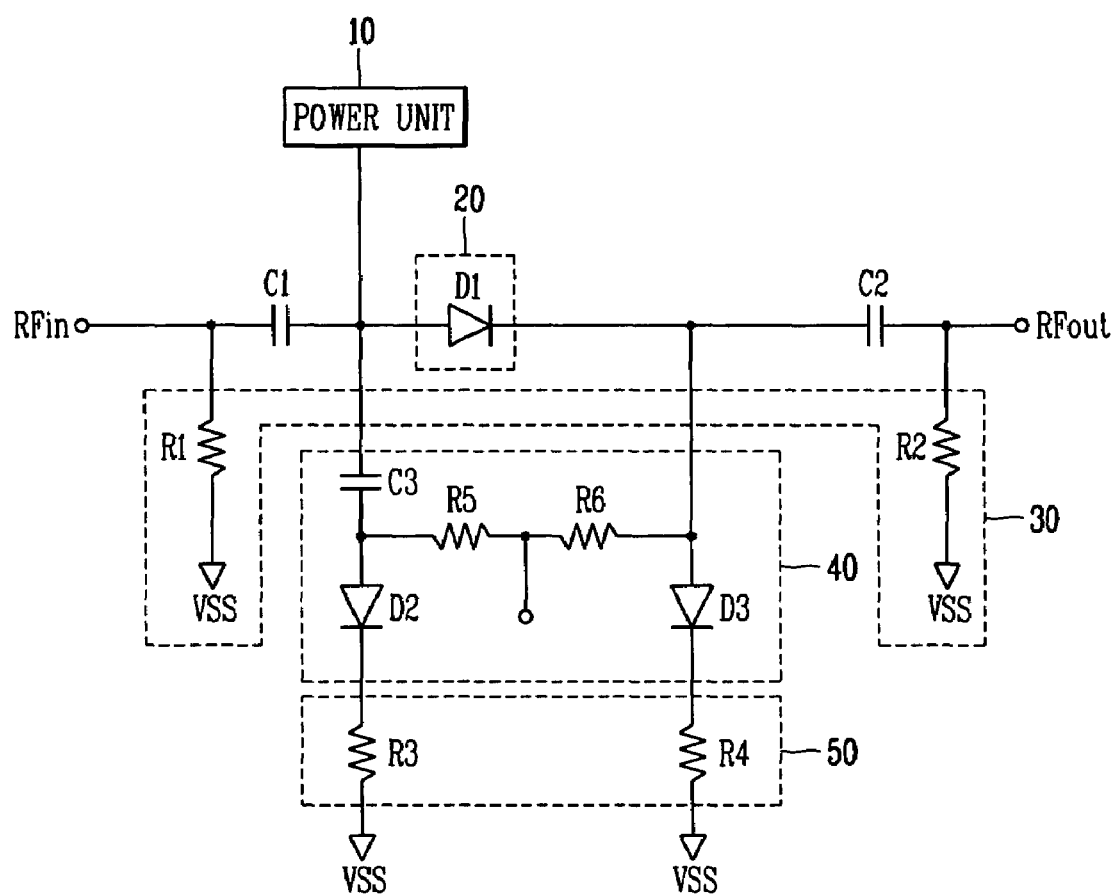
FIG. 2 is a circuit diagram illustrating a variable attenuator, in accordance with one embodiment of the invention.

Referring to FIG. 2, a variable attenuator in accordance with one embodiment of the invention comprises a capacitor C1 for removing serial current elements from a RF signal; a power unit 10 for providing a fixed voltage of a certain level; an attenuator 20 for attenuating the RF signal transmitted through the capacitor C1 according to the fixed voltage of the power unit 10; an impedance matching unit 30 for maintaining impedance matching of the attenuator 20 in a low attenuation mode; an attenuator 40, for example, parallel-contacted to the attenuator 20 for attenuating the RF signal transmitted through the capacitor C1 according to the control voltage determining an attenuation mode; and an impedance matching unit 50 for maintaining input/output impedance matching of the attenuator 40 in a high attenuation mode.

The impedance matching units 30 and 50, respectively, may comprise one or more 50Ω resistance means (i.e., resistors) R1~R4, for example, in certain embodiments. The power unit 10 outputs a fixed voltage of about 1.3V by dividing a power voltage (Vcc), the attenuator 20 comprises at least one PIN diode or short key diode (schottky diode), in one embodiment. The provided resistance and voltage values above and in the rest of the disclosure are exemplary. It is noteworthy that the invention should not be construed as limited to such values or approximations.

The attenuator 40 comprises a capacitor C3, for example, parallel-contacted to an input terminal of the attenuator 20. A short key diode D2 for attenuating the RF signal transmitted through the capacitor C3; a short key diode D3, for example, parallel-contacted to an output terminal of the attenuator 20; and resistance means R5 and R6 provided between anodes of the short key diodes D2 and D3, may be also in an operational relationship with capacitor C3, as illustrated, in accordance with one or more embodiments.

The resistance means R5 and R6 apply the control voltage received through a control voltage input terminal to the short key diodes D2 and D3, for example. C3 cuts off the control voltage transmission to the attenuator 20, in one or more embodiments.

In one or more embodiments of the invention, an attenuation mode of the variable attenuator is determined by a level of the control voltage. For example, when a control voltage is not greater than approximately 0V~0.6V, the variable attenuator is operated in a low attenuation mode. If a control voltage is not greater than approximately 0.6V~1.3V, the variable attenuator is operated in an intermediate attenuation mode. If a control voltage is not less than approximately 1.3V, the variable attenuator is operated in a high attenuation mode. The provided voltage ranges for determining the attenuation mode is not fixed, but can be varied according to a range of voltages outputted from the power unit 10.

In the above-described attenuation modes, the RF signal passing the capacitor C1 is attenuated through different paths. That is, the RF signal passing the capacitor C1 in the low attenuation mode flows to the attenuator 20. In the intermediate attenuation mode, the RF signal flows to the attenuators 20 and 40, for example. In the high attenuation mode, the RF signal flows to the attenuator 40, for example. When a control voltage of approximately 0V is applied, the variable attenuator is operated in the low attenuation mode. Based on the control voltage of 0V, internal resistance of the short key diodes D2 and D3 of the attenuator 40 is ∞ respectively. Thus, RF signal transmitted through the capacitors C1 and C3 does not flow to the attenuator 40.

The power unit 10, in one embodiment, divides the power voltage (Vcc) and applies the fixed voltage of about 1.3V to the attenuator 20, for example. The voltage of about 1.3V higher than a turn-on voltage is applied to the anode of the short key diode D1 by the fixed voltage, for example. Because internal resistance of the short key diode D1 is approximately 0Ω, the RF signal transmitted through the input terminal RFin and the capacitor C1 is transmitted to the output terminal RFout as it is (without being attenuated) through the attenuator 20 and the capacitor C2. In that case, the input/output impedance of the attenuator 20 is maintained at about 50Ω by the impedance matching unit 30, for example.

When the control voltage is increased, a forward bias is applied to the anode of the short key diodes D2 and D3 to turn on the short key diodes D2 and D3. When the control voltage is about 0.6V, the short key diode D1 maintains the turn on state, however, because internal resistance is increased a little in comparison with the state in the control voltage of about 0V, the short key diodes D2 and D3 are in a transition state for being turned on. Accordingly internal resistance is a little less than ∞ for the short key diodes D2 and D3.

The RF signal transmitted through the capacitor C1 is attenuated mainly in the attenuator 20 and a little in the attenuator 40. Herein, input/output impedance is in the matching state as before but is less than about 50Ω by the resistance means R1~R4. The resistance means are resistors in accordance with one embodiment.

When the control voltage is about 1V, internal resistance of the short key diode D1 is increased. Internal resistance of the short key diodes D2 and D3 is decreased, however. Accordingly, the RF signal transmitted through the capacitor C1 is attenuated mainly through the short key diodes D2 and D3. Input/output impedance is less than about 50Ω by the resistance means R1~R4 of the impedance matching units 30 and 50.

As described above, in the intermediate attenuation mode, attenuators 20 and 40 are operated and the RF signal is attenuated through the short key diodes D1~D3. Input/output impedance is less than about 50Ω due to the resistance means R1~R4 in the impedance matching units 30 and 50. The intermediate attenuation mode is maintained until a voltage difference between the anode and the cathode of the short key diode D1 reaches about 0V, for example. When a fixed voltage of about 1.3V, outputted from the power unit 10 is applied to the anode of the short key diode D1 and a control voltage higher than about 1.3V is applied to the cathode, mode of the variable attenuator is changed from the intermediate attenuation mode into the high attenuation mode.

When the variable attenuator is operated in the high attenuation mode, the cathode voltage of the short key diode D1 is greater than the anode voltage (e.g., 1.3V). Accordingly, internal resistance of the short key diode D1 is ∞ and the RF signal transmitted through the capacitor C1 flows to the short key diodes D2 and D3, for example. Input/output impedance is increased again from a certain time point of the intermediate attenuation mode, and input/output impedance reaches about 50Ω again in the high attenuation mode by the impedance matching unit 50, because input/output impedance is, for example, forcibly set on the resistance means R3 and R4 at about 50Ω, for example.

As described above, in one embodiment of the present invention, by connecting the impedance matching unit 50 to the attenuator 40, input/output impedance can be maintained at about 50Ω in the high attenuation mode. By separately constructing a first attenuator operated in a low attenuation mode and a second attenuator operated in a high attenuation mode and contacting resistance of about 50Ω to the second attenuator, it is possible to maintain input/output impedance of about 50Ω in each attenuation mode.

In one or more embodiments of the invention, by maintaining impedance matching in each mode, it is possible to secure stability of a variable attenuator, in use for a LNA of a receiver. There is no need to vary pass band characteristics of a duplexer and a reception filter, as a result. In addition, in radio reception, unlike the conventional art, it is possible to prevent reception level lowering phenomenon caused by miss matching with an antenna.

The embodiments described above are to be considered in all aspects as illustrative only and not restrictive in any manner. Thus, other exemplary embodiments, system architectures, platforms, and implementations that can support various aspects of the invention may be utilized without departing from the essential characteristics described herein. These and various other adaptations and combinations of features of the embodiments disclosed are within the scope of the invention. The invention is defined by the claims and their full scope of equivalents.

What is claimed is:

1. A variable attenuator comprising:
   a first attenuator for attenuating a RF signal according to a fixed voltage;
   a second attenuator connected in parallel to the first attenuator and attenuating the RF signal according to a control voltage for determining an attenuation mode; and
   a first impedance matching unit for maintaining input/output impedance matching of the second attenuator,
   wherein the second attenuator comprises:
      a third capacitor connected in parallel to an input terminal of the first attenuator,
      a first diode for attenuator the RF signal transmitted through the third capacitor, and
      a second diode connected in parallel to an output terminal of the first attenuator.

2. The attenuator of claim 1, further comprising:
   a second impedance matching unit for maintaining input/output impedance matching of the first attenuator.

3. The attenuator of claim 1, further comprising:
   a first capacitor for removing serial current elements from an input RF signal and for providing the RF signal to the first attenuator; and
   a second capacitor for removing serial current elements from an output signal of the first and second attenuators.

4. The attenuator of claim 1, wherein the first attenuator comprises a diode.

5. The attenuator of claim 1, wherein the fixed voltage is a power voltage divided by a certain level.

6. The attenuator of claim 1, wherein the RF signal flows to the first attenuator in a low attenuation mode.

7. The attenuator of claim 1, wherein the RF signal flows to the second attenuator in a high attenuation mode.

8. The attenuator of claim 1, wherein the RF signal flows to the first and second attenuators in an intermediate attenuation mode.

9. The attenuator of claim 1, wherein the second attenuator comprises a first and a second resistance means connected in serial between anodes of the first and second diodes.

10. The attenuator of claim 9, wherein the second attenuator comprises a control voltage input terminal is provided between the first and second resistance means.

11. A variable attenuator comprising:
a first attenuator for attenuating a RF signal according to a first voltage;
a first impedance matching unit for maintaining impedance matching of the first attenuator in a low attenuation mode;
a second attenuator provided between input and output terminals of the first attenuator for attenuating the RF signal according to a control voltage for determining an attenuation mode,
wherein the second attenuator comprises:
a third capacitor connected in parallel to an input terminal of the first attenuator for cutting off a control voltage to the first attenuator;
a first diode for attenuating the RE signal transmitted through the third capacitor;
a second diode connected in parallel to an output terminal of the first attenuator; and
first and second resistance means corrected to anodes of the first and second diodes for applying the control voltage; and
a second impedance matching unit for maintaining input/output impedance matching of the second attenuator in a high attenuation mode,
wherein the second impedance matching unit comprises at least two resistors provided between the second attenuator and a ground connection.

12. The attenuator of claim 11, wherein die first and second impedance matching units have the same resistance.

13. The attenuator of claim 11, wherein the at least two resistors each have a resistance of 50Ω.

14. The attenuator of claim 11, wherein the RF signal flows to the first attenuator in a low attenuation mode and flows to the second attenuator in a high attenuation mode.

15. The attenuator of claim 11, wherein the RF signal flows to the first and second attenuators in an intermediate attenuation mode.

16. A variable attenuator comprising:
a first diode for attenuating a RF signal according to a first voltage;
a second diode, connected in parallel to an anode of the first diode for attenuating the RF signal, according to a control voltage;
a third diode connected in parallel to a cathode of the first diode for attenuating the RF signal, according to the control voltage;
a first resistor provided between a cathode of the second diode and a ground connection; and
a second resistor provided between a cathode of the third diode and the ground connection.

17. The attenuator of claim 16, further comprising:
a capacitor connected to the anode of the first diode for cutting off a control voltage provided to the first diode.

18. The attenuator of claim 16, further comprising:
third and fourth resistors for applying the control voltage to the anodes of the second and third diodes, respectively.

19. The attenuator of claim 16, wherein the first and second resistors are approximately 50Ω.

20. The attenuator of claim 16, wherein the RF signal flows to the first diode, in a low attenuation mode.

21. The attenuator of claim 16, wherein the RF signal flows to the second and third diodes in a high attenuation mode.

22. The attenuator of claim 16, wherein the RF signal flows to the first, second, and third diodes, in an intermediate attenuation mode.

23. A variable attenuator comprising:
a first attenuator for attenuating a RF signal according to a fixed voltage;
a second attenuator connected in parallel to the first attenuator and attenuating the RF signal according to a control voltage for determining an attenuation mode; and
a first impedance matching unit for maintaining input/output impedance matching of the second attenuator,
wherein the second attenuator comprises:
a first diode connected in parallel to an input terminal of the first attenuator; and
a second diode connected in parallel to an output terminal of the first attenuator
a third capacitor connected in parallel to an input terminal of the fist attenuator;
wherein the first diode attenuates the RF signal transmitted through the third capacitor.

* * * * *